United States Patent [19]

DeVries

[11] 4,333,065
[45] Jun. 1, 1982

[54] LOW REFLECTIVITY APODIZED SURFACE ACOUSTIC TRANSDUCER WITH MEANS TO PREVENT WAVEFRONT DISTORTION

[75] Inventor: Adrian J. DeVries, Mount Prospect, Ill.

[73] Assignee: Zenith Radio Corporation, Glenview, Ill.

[21] Appl. No.: 195,587

[22] Filed: Oct. 9, 1980

[51] Int. Cl.³ ............... H03H 9/145; H03H 9/25; H03H 9/64
[52] U.S. Cl. ............................ 333/194; 310/313 C; 333/151; 333/154
[58] Field of Search ............... 333/150–155, 333/193–196; 310/313 R, 313 A, 313 B, 313 C, 313 D; 331/107 A

[56] References Cited

U.S. PATENT DOCUMENTS

| | | | |
|---|---|---|---|
| 4,023,124 | 5/1977 | Parker et al. | 333/196 |
| 4,144,508 | 3/1979 | Lewis et al. | 333/196 |
| 4,158,823 | 6/1979 | Kuny et al. | 333/151 |

Primary Examiner—Marvin L. Nussbaum

[57] ABSTRACT

In order to reduce the reflectivity of an apodized surface acoustic wave transducer, one portion of the dummy area thereof is bare and another portion is 100% metallized, and the boundary between these two regions is shaped to equalize total acoustic transit times across the transducer aperture. This avoids any net refraction, and thus permits any acoustic wavefronts which traverse the two regions to remain flat.

10 Claims, 8 Drawing Figures

LOW REFLECTIVITY APODIZED SURFACE ACOUSTIC TRANSDUCER WITH MEANS TO PREVENT WAVEFRONT DISTORTION

This invention relates generally to electro-acoustic devices, and particularly to a surface acoustic wave transducer.

BACKGROUND

An interdigital surface acoustic wave transducer has the property of converting electrical to acoustic energy, or vice versa, where and only where two arrays of metallic fingers are interleaved with each other. Devices comprising two or more such transducers printed on the surface of a piezoelectric substrate are manufacturable by photographic techniques common in the integrated circuit industry, and have been widely used as intermediate frequency bandpass filters for television receivers. In the T.V. environment it is quite important that these filters exhibit low acoustic reflectivity. Otherwise "triple transit" echoes can produce objectionable ghost images on the picture screen.

In the past such reflections have been minimized by various stratagems. The interdigitated fingers of at least one of the filter transducers have been of the "split-connected" type, in which each finger is divided into two parts at the same electrical potential. Such fingers are effective to minimize reflections when the impedance of the transducer is high in comparison to the external load or source impedance to which it is connected in the I.F. section of the T.V. set. When crystalline lithium niobate (LiNbo$_3$) is used as the piezoelectric substrate material, the impedance of the transducers is typically about 300 $\Omega$, while the external load and source circuits encountered in the I.F. circuit are of the order of only 50 $\Omega$. Thus the conditions for low reflectivity are satisfied with LiNbO$_3$.

This low reflectivity permits some important design trade-offs to be made, without producing objectionable reflection levels. It is desirable that at least one of the interdigital transducers of the filter have 50% duty cycle single fingers (i.e., fingers which are not split in two, and which have a thickness equal to the spaces between fingers), because this 50% configuration increases the filter production yield (it is less sensitive to defects in the photofabrication process) and also because it has a lower third harmonic response (such filters are quite selective for the intermediate frequency, but do exhibit spurious responses at the third harmonic thereof). A disadvantage of the 50% configuration is that it has a higher reflection coefficient. This can usually be tolerated, however, on a LiNbO$_3$ substrate because in that case one of the transducers can be of the split-connected type, which has a very low reflection coefficient because of the favorable impedance relationships.

Crystalline LiNbO$_3$ is quite expensive. It would be desireable to replace that material with a cheaper piezoelectric ceramic, such as lead titanate (PbTiO$_3$). But ceramic materials are made by a sintering process, and do not have as perfect a surface as a polished crystalline material. Microscopic pits in the surface of such a substrate may cause voids in the metal fingers, thereby reducing the production yield of filters. Moreover the surface acoustic velocity of PbTiO$_3$ is about 30% lower than that of LiNbO$_3$. A lower acoustic velocity means a proportionately smaller acoustic wavelength, which in turn dictates proportionately smaller finger dimensions. This makes the production yield even more vulnerable to surface imperfections, because a given size void represents a larger fraction of the finger area.

The production yield of PbTiO$_3$-based filters can be improved by using single fingers (instead of the split configuration) for all the transducers, because a given size void then represents a smaller fraction of the finger area. But solid fingers have a large reflection coefficient.

PbTiO$_3$ also has a higher dielectric constant than LiNbO$_3$, and therefore the transducer impedances are much lower (of the order of 30 $\Omega$). This is lower than the 50 $\Omega$ source and load impedances typically encountered in the T.V. environment. When such an unfavorable impedance relationship is encountered, no improvement in reflectivity can be attained by employing split-connected fingers, even if one were willing to tolerate the yield reduction resulting from the split finger configuration.

Thus the use of single finger transducers is indicated on a PbTiO$_3$ ceramic substrate. Accordingly, it is desireable to find some way of decreasing the reflection levels encountered in such transducers. One way to reduce reflections is to eliminate unnecessary transducer fingers or portions thereof, and thus reduce the number and/or length of reflecting metal edges.

It is common in the art to use "apodization" in at least one of a filter's transducers in order to optimize its frequency response. Apodization involves limiting the active portion of the transducer to an area smaller than the entire transducer area. (The "active" area is that region in which electrically opposed fingers are interdigitated to transduce electrical to acoustic energy or vice versa). The "dummy" or inactive area of the transducer may have many noninterdigitated finger portions, the edges of which all give rise to reflections. If these inactive finger portions could be eliminated, then the total reflecting edge length would be reduced and overall reflectivity lowered.

But if these finger portions are removed, then the surface acoustic velocity in the bare substrate area is higher than that of the finger-filled active area. This causes the transducer to behave like a lens, bending the acoustic wavefronts which pass through it. Such bending not only disperses the acoustic energy, but it also makes the wavefront appear to lose phase coherency as "seen" by the straight fingers of the transducers. Phase coherency in relation to these fingers is essential to the satisfactory operation of the transducers, and in particular to the frequency selectivity of the filter.

Another alternative is to cover the entire dummy area with a 100% blanket of conductive material, which has only one reflecting edge instead of many. But this makes the surface acoustic velocity in the dummy area lower than that of the active area, because the latter is not entirely covered by metal. Therefore the dummy area would again behave like a lens, which cannot be tolerated.

The present invention reduces the reflection level of an apodized transducer by eliminating multiple metal edges in the dummy area; but it does so without distorting acoustic wavefronts from their required flat configuration. Instead of employing either a totally bare or a 100% metallized substrate in the dummy area, this invention employs partial metallization in a unique pattern such that, despite differences in surface acoustic velocities between metallized, partially metallized, and fully metallized areas, the total acoustic transit time is equalized across substantially the entire transducer aperture. This causes all acoustic wavefronts to remain flat as they pass through the transducer. This design is particularly advantageous when PbTiO$_3$ ceramic or any similar material is used as a substrate.

The features of the invention will be more fully understood by reference to the detailed description of the preferred embodiments which follows, when read in conjunction with the accompanying drawings.

DRAWINGS

DETAILED DESCRIPTION OF THE PREFERRED EMBODIMENTS

Figure 1:
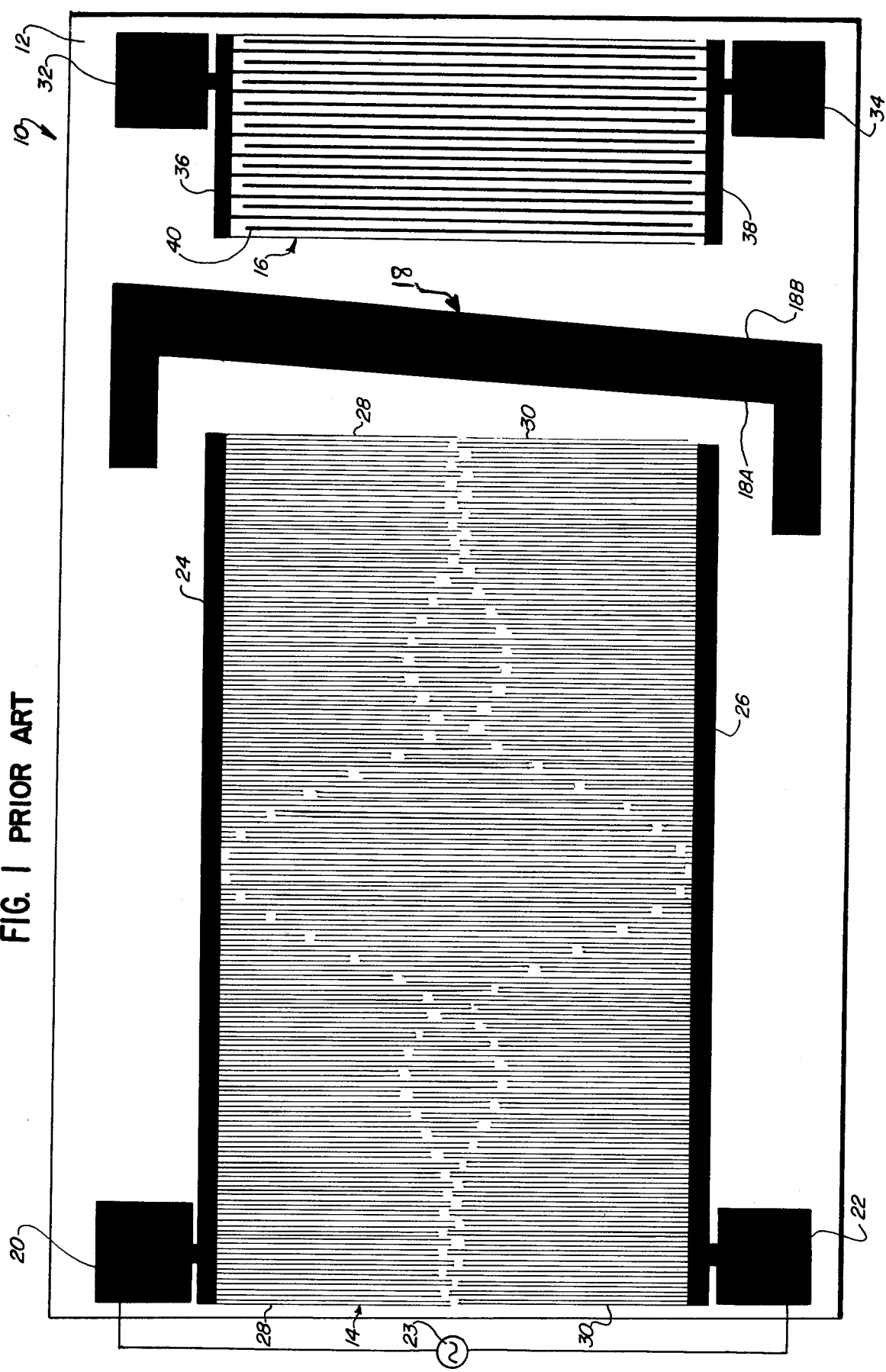
FIG. 1 is a schematic illustration of a surface acoustic wave filter containing a prior art apodized transducer employing an LiNbO$_3$ substrate.

In order to understand the unique features of this invention, it is best to begin with a description of a prior art device as illustrated in FIG. 1. A filter 10 comprises a substrate 12 of LiNbO$_3$ material upon which are printed metallic lines forming an input interdigital transducer 14, an output interdigital transducer 16, and an electrostatic shield 18. The input transducer 14 includes a pair of input terminal pads 20 and 22, across which an electrical input signal source 23 is connected. The terminal pads are connected to respective bus bars 24 and 26. Respective arrays of fingers 28 and 30 extend toward each other from the bus bars 24 and 26, and are interdigitated in certain areas to generate a surface acoustic wave which travels across the substrate 12 toward the output transducer 16. The latter has output terminal pads 32 and 34 from which the electrical output of the filter 10 is taken. These pads are connected to respective bus bars 36 and 38. Fingers 40 extend from both bus bars 36 and 38, and interdigitate therebetween to transform the acoustic wave back into an electrical signal.

Not all of the acoustic energy impinging upon the output transducer 16 is converted to electrical energy. Some of it is reflected back toward the input transducer 14, and some of that reflected energy is re-reflected from the input transducer back to the output transducer. The multiple transit times cause the second reflection to appear as a time-delayed "ghost" signal at the output transducer 16. Such a ghost can cause objectionable duplicate images on the T.V. screen.

The shield 18 contributes to the undesired reflections, but is angled slightly to disrupt the phase coherency of the waves which it reflects, relative to the non-tilted transducer fingers 28, 30 and 40. The shield edges 18A and B are parallel to each other, however, to avoid distorting the wavefront of the direct acoustic wave.

One of the transducers has single fingers for reduced responsiveness to interference at the I.F. third harmonic. In this case, it is the output transducer 16 which has single fingers 40; but it could have been otherwise. The other transducer, in this case input transducer 14, has opposed bifurcated fingers 28 and 30, with both halves of each finger 28 connected to the same bus bar 24 and both halves of each finger 30 connected to bus bar 26. When crystalline LiNbO$_3$ is used for the substrate 12, the impedance of the input transducer 14 is typically high compared so that of the I.F. signal source 23; and as a result this "split-connected" configuration results in reduced reflectivity, which helps to minimize triple transit ghost reflections. But crystalline LiNbO$_3$ is an expensive material. One of the objects of this invention is to replace it with a less expensive material, such as PbTiO$_3$ ceramic.

Figure 2:
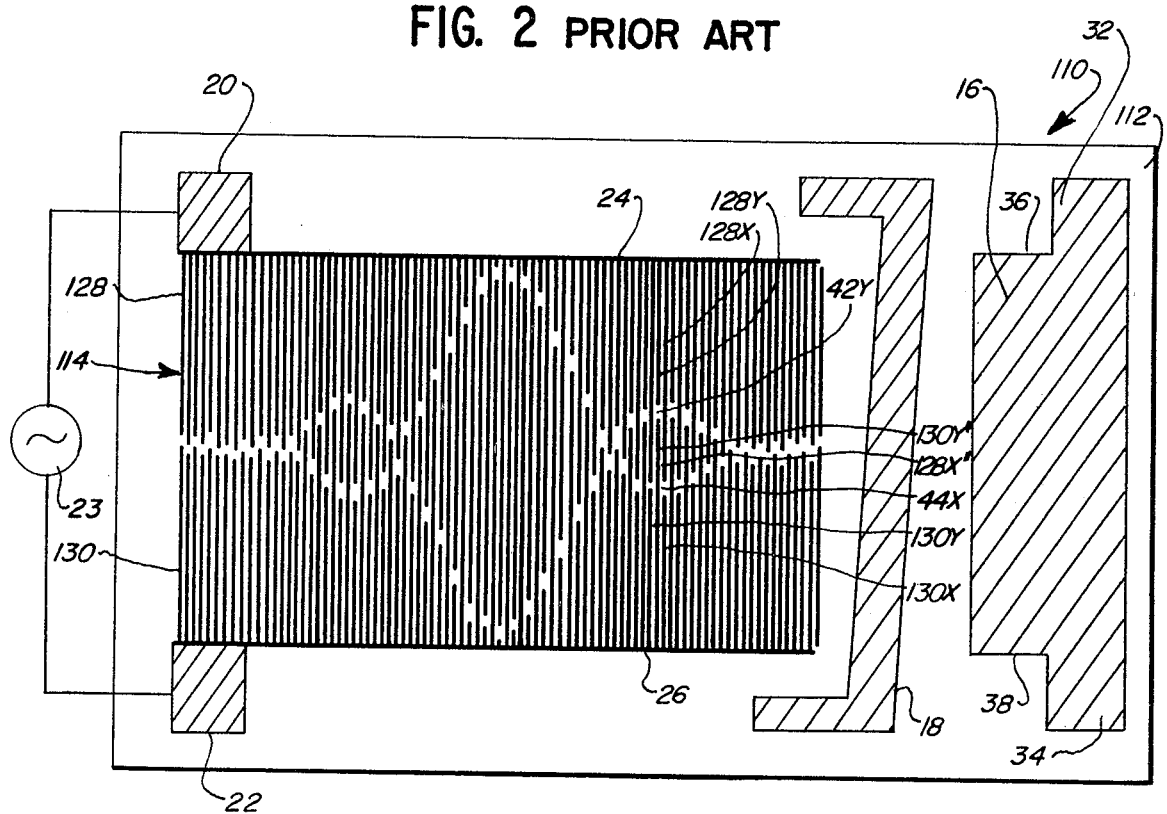
FIG. 2 is a schematic illustration of a similar filter employing a PbTiO$_3$ substrate.

FIG. 2 illustrates another prior art filter 110 employing a different form of input transducer 114, and the same output transducer 16, shield 18, terminal pads 20, 22 and 32, 34, and bus bars 24, 26 and 36, 38 printed upon a PbTiO$_3$ ceramic substrate 112. (Since they are unchanged from FIG. 1, all of these elements are illustrated only schematically in FIG. 2.) Because of the inherently lower quality of a ceramic surface, which has more imperfections than a polished crystalline surface, it is advisable in this case to avoid the use of split fingers in the input transducer 114, and to use instead single fingers 128 and 130 with a 50% spatial duty cycle. This improves the production yield, because voids in the fingers have a less serious effect. But now the reflectivity of the input transducer 114 is undesirably high; both because the PbTiO$_3$ substrate material causes it to have a lower impedance than the signal source 23, and also because the single fingers 128 and 130 are more reflective than the split-connected fingers 28 and 30 in FIG. 1. Accordingly, it is desirable to find some way of reducing the reflectivity of a transducer on a PbTiO$_3$ substrate.

Figure 3:
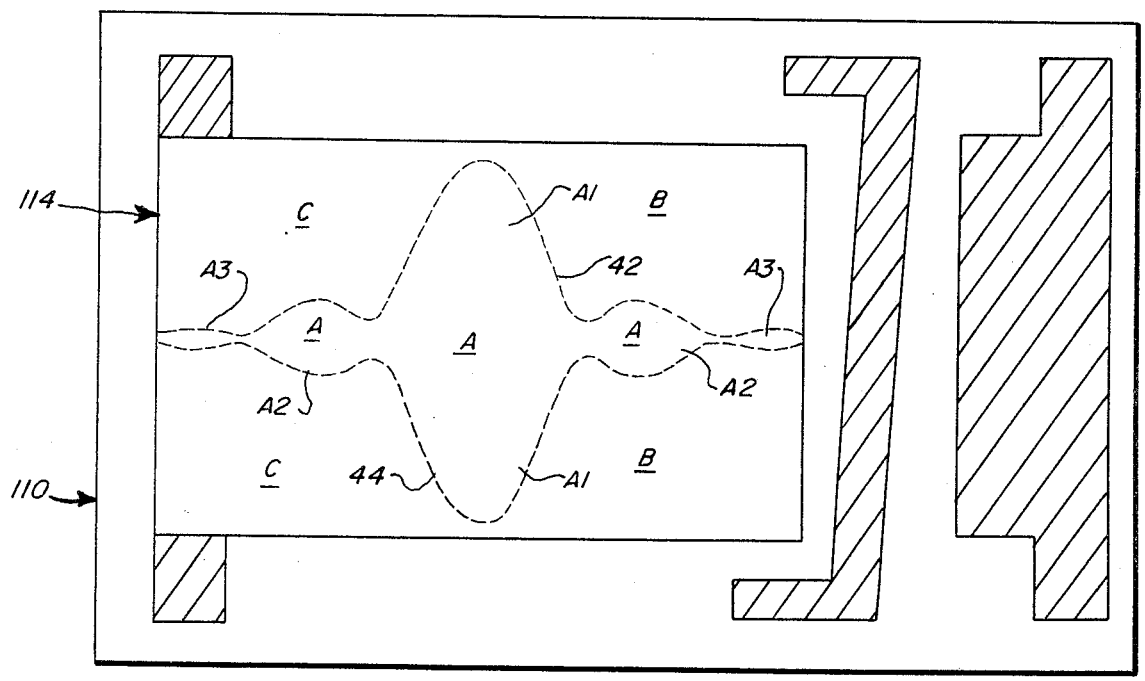
FIG. 3 is a schematic illustration of the filter of FIG. 2, including a generalized map of the apodized transducer, indicating various portions of the active and inactive areas thereof.

As is common in the art, one of the two transducers in each filter 10 and 110 is "apodized" to improve its response at the T.V. intermediate frequency. In each case illustrated herein it is the input transducers (e.g. transducers 14 and 114) which are apodized, but it could just as well be the ouput transducer (e.g. transducers 16 and 116). The meaning of apodization is best illustrated in FIG. 3, which shows the same filter 110 as in FIG. 2, but with the apodized input transducer 114 illustrated schematically and divided (conceptually) into separate areas A, B, and C. Area A is the active region, so called because within it the opposed fingers (e.g., fingers 128 and 130 extending from the opposite bus bars 24 and 26 respectively) are interdigitated to produce acoustic waves. In contrast "dummy" areas B and C are inactive (do not produce any acoustic waves), because within those areas the opposed fingers are not interdigitated. In some filter designs the output transducer 16 might be apodized; in that case the active area would be defined as one within which the fingers extending from opposite bus bars interdigitate to convert received acoustic waves into an electrical output. The dummy areas of an output transducer would be defined as those within which these fingers do not interdigitate, and thus do not transduce acoustic waves to electrical energy collectible at the terminals 32 and 34.

The shapes of areas A, B, and C are determined by the locations of respective gaps or interruptions in the electrical continuity of each individual finger 128, 130. In FIG. 2 each finger 128 connected to bus bar 24 is colinear with one of the fingers 130 connected to the opposite bus bar 26, and electrically isolated therefrom by a non-conductive gap. In particular, finger 128X connected to bus bar 24 is separated by a gap 44X from a co-linear finger 130X connected to bus bar 26; while a neighboring finger 128Y connected to bus bar 24 is co-linear with, but separated by a gap 42Y from, neighboring finger 130Y connected to bus bar 26. Only those portions of neighboring fingers 128X and 130Y which are located between gap locations 42Y and 44X (i.e. the centrally located finger portions 128X' and 130Y') are interdigitated with each other and also electrically connected to opposite bus bars 24 and 26 (the two necessary conditions for transducer action). Therefore only these short centrally located finger lengths 128X' and 130Y' are active. The length of finger 128X which is between bus bar 24 and gap 42Y is inactive because it is not interdigitated with any portion of any finger connected to the opposite bus bar 26. Similarly the length of finger 130Y between bus bar 26 and gap 44X is inactive because it is not interdigitated with any finger connected to the opposite bus bar 24. In addition the entire length of finger 128Y is between bus bar 24 and gap 42Y, and the entire length of finger 130X is between bus bar 26 and gap 44X; and therefore all of fingers 128Y and 130X are also inactive for the same reason. Thus the loci of all gap locations such as 42Y and 44X define two envelopes 42 and 44 respectively (FIG. 3) which enclose the active area A and demarcate its upper and lower boundaries respectively with the dummy area B and C.

The usual apodization technique is to employ a particular curvature for boundaries 42 and 44 which, together with the spacing of the fingers 128 and 130, optimizes the frequency response of the transducer. Such a curve normally forms an active area A which has one major lobe A1 and possibly secondary lobes A2, tertiary lobes A3, or even higher order lobes, with the sizes of the lobes decreasing as their order increases. The dummy area is (conceptually) divided into a forward portion B which is located between the major lobe A1 and the output transducer 16, and a rearward portion C which is located on the opposite side of the major lobe A1.

The dummy areas B and C of an apodized transducer can be major sources of undesired reflections. In the case of an apodized output transducer, these reflections would be the double transit echoes bounced back to the input transducer. In the case of an apodized input transducer, these would be the re-reflections (triple transit) bounced forwardly toward the output transducer to cause delayed (ghost) images on the picture screen. The reason for this will be most apparent from referring back to FIG. 2. There it is seen that the non-interdigitated portions of transducer 114 (corresponding to dummy areas B and C) are filled with inactive portions of single fingers (such as portions 128X and Y and 130X and Y) which reflect strongly.

These inactive finger portions are superfluous so far as the generation (or reception) of acoustic waves is concerned, since (input or output) transducer action takes place, for each pair of adjacent fingers such as 128X and 130Y, only in the region where the respective oppositely connected finger portions 128X' and 130U' overlap each other, i.e., between locations 42Y and 44X, or, more generally, within the active region A enclosed by envelopes 42 and 44. The active finger portions in area A also reflect strongly, of course; but these finger portions are essential to transducer action, and so their reflections must be tolerated if the transducer is to perform its (input or output) function. The dummy areas B and C, however, represent an opportunity to reduce the overall reflectivity of the transducer if the inactive finger portions such as 128X, Y and 130X, Y can be eliminated or the number of their metal edges reduced substantially.

Two possibilities exist for accomplishing this objective. If all or some of the inactive finger portions are simply removed, leaving the dummy area or some portion thereof bare (electrical connections can still be accomplished by conforming the bus bars 24 and 26 to the curvature of envelopes 42 and 44), then the source of reflections in areas B and C is entirely eliminated. Alternatively, if the entire dummy area or some portion thereof is 100% metallized, i.e. if the spaces between inactive finger portions such as 128X, Y and 130X, Y are covered with metal), then there will be only a single reflective metal edge instead of many; and the reflectivity will be greatly reduced. Either of these approaches will make no difference to the transducer action of an apodized (input or output) transducer, since the inactive areas B and C where such changes are to be made are not involved in the process of generating acoustic waves or reconverting them to electrical energy. Hence both these approaches, and any combination of the two, are perfectly acceptable, at least so far as dummy area C (located rearwardly of major lobe A1) is concerned.

But neither 100% metallization nor zero metallization will work for dummy area B. Because area B is located between major lobe A1 and the transducer 16 to which it is acoustically coupled, a major portion of the acoustic wave moving from active area A of input transducer 114 to output transducer 16, especially the portion contributed by major lobe A1, must pass through dummy area B; and it must pass through without having its wavefront distorted, because that would destroy its phase coherency so far as transducer 16 is concerned. The acoustic wavefront starts out flat as it leaves active area A, because the active finger portions 128X' and 130Y' in area A are straight line segments. It must remain flat upon arriving at transducer 16; becasue the fingers 40 thereof are also straight line segments, and a phase coherency relationship between the wavefront and the fingers implies a geometric match between their shapes. Therefore, no wavefront distortion can be allowed during transit through area B.

Buf if a flat wavefront encounters a wave propagation velocity gradient across its path (i.e., if one portion of the wavefront travels faster than another), then the wavefront will bend. The active area A, which is 50% covered with metal fingers 128X', 130Y', etc., has a surface acoustic velocity which is somewhere between that of the bare substrate 112 and a 100% metallized portion thereof. If the entire dummy area were bare, the propagation velocity for the acoustic wave generated in the active area A would be higher in the dummy area than in the active area. This would be acceptable for dummy area C, because an acoustic wave transitting that area is not on its way to transducer 16, and thus, is not going to play a role in the operation of the filter 110. But a higher propagation velocity in dummy area B would affect that portion of the wave which is on its way to transducer 16, and which therefore is crucial to the operation of the filter 110. It would cause the wavefront to assume a concave shape (as "seen" from transducer 16) instead of the flat shape required for satisfactory operation of that transducer. Conversely, if any part of the dummy area were 100% metallized its propagation velocity would be slower than that of active area A. That too would be acceptable in area C; but if done in area B the crucial acoustic wavefront would be bent into a convex configuration (as "seen" from transducer 16), again impairing the operation of that transducer.

These considerations apply to any apodized transducer, even if it is used on the output side of a filter; because in the latter case the arriving wavefront will not be flat if it has to pass through a 100% bare or 100% metallized dummy area before reaching the major lobe of the active area. Thus, in general the problem is how to treat that portion of the dummy area of any apodized input or output transducer which is located between the active area thereof and some other transducer to which it is acoustically coupled.

Figure 4:
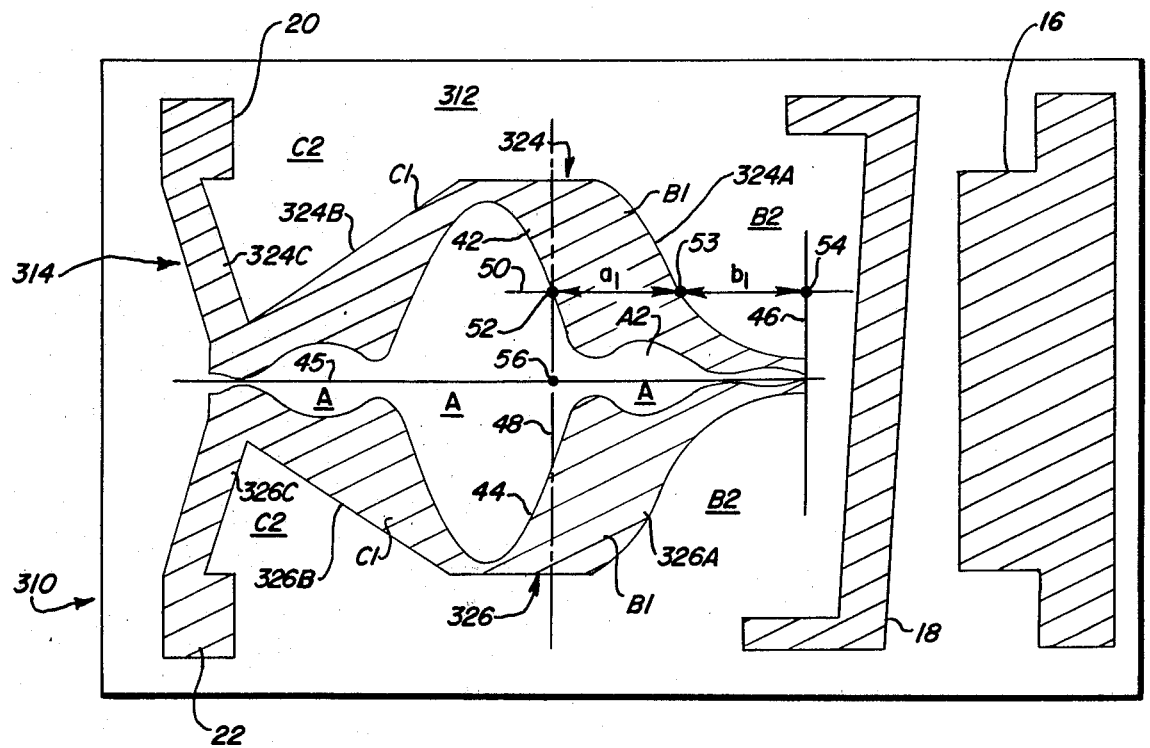
FIG. 4 is a schematic illustration of a filter containing an apodized transducer in accordance with this invention.

FIG. 4 shows a filter 310 which has, upon a PbTiO$_3$ ceramic substrate 312, a conventional output transducer 16 and shield 18, plus a uniquely designed input transducer 314 in accordance with this invention. In this design a portion B1 of area B is 100% metallized, but the remainder B2 of area B is 100% bare. Bus bars 324 and 326 are so shaped that portions thereof are thickened to coincide with metallized area B1, and respective edges 324A and 326A of these thickened portions form the boundaries between metallized areas B1 and bare areas B2. This significantly reduces the reflectivity of area B because, instead of the reflecting edges of many dummy fingers such as 128X, Y and 130X, Y (FIG. 2) there is now only one reflecting edge 324A or 326A in each B dummy area on each side of the longitudinal axis 45 of the transducer 314. (The axis 45 bisects the transducer 314 and extends in the acoustical beam propagation direction, i.e., from input transducer 314 to output transducer 16.)

In order to keep the metallized areas B1 and bare areas B2 from distorting flat acoustic wavefronts passing through them, the edges 324A and 326A are so shaped that the total acoustic transit time from active area A to the end of input transducer 314 is substantially equal across all or almost all of the width (aperture) of the transducer. The "end" of the transducer is defined, for this purpose, as a line 46 which is perpendicular to axis 45 and which coincides with that transducer finger in the active area A which is reached last by an acoustic wavefront as it exits from input transducer 314 on its way toward output transducer 16. (If this design were applied to an apodized output transducer, then the "end" of the transducer for this purpose would be a similar line coinciding with the first active transducer finger reached by an incoming acoustic wave at the entrance side of the transducer.) The width or aperture of the transducer is the distance along a direction parallel to line 46 from one peak of major lobe A1 to the other; i.e., the maximum width of active area A.

In order to meet this design criterion the shapes of the edges 324A and 326A must be such that the acoustic transit time from any arbitrarily selected line 48 to line 46 along a path 50 must be the same for any point on line 48 (where line 48 is parallel to line 46, and line 50 is perpendicular thereto). When the point on line 48 is one such as point 52, which lies on the envelope 42 or 44 and outside the maximum width of any of the minor lobes A2, A3, etc., then the length of the total acoustic path from line 48 to line 46 is $a_1 + b_1$, where $a_1$ is the distance from point 52 (the intersection of line 48 and envelope 42 or 44) along path 50 to point 53 (the intersection of path 50 with edge 324A or 326A), and $b_1$ is the distance from point 53 along path 50 to point 54 (the intersection of path 50 with line 46, the end of the transducer). Distance $a_1$ is entirely within the metallized area B1. Therefore, the acoustic transit time for distance $a_1$ is $a_1/V_M$, where $V_M$ is the surface acoustic velocity in the metallized area B1. Distance $b_1$, on the other hand, is entirely within the bare area B2. Therefore, the acoustic transit time for distance $b_1$ is $b_1/V_F$, where $V_F$ is the surface acoustic velocity on the substrate surface when it is free of all conductive loading. It follows that the total transit time over path $a_1 + b_1$ equals $a_1/V_M + b_1/V_F$.

But for a point on line 48 such as point 56, which is at or near the intersection of line 48 with the longitudinal axis 45, the entire path from line 48 to line 46 is entirely within the active area A, passing through part of lobe A1 and all of lobes A2 and A3. The total distance traversed from line 48 to line 46 is still $a_1 + b_1$, but the wave propagation velocity over such a path within the active area A is $V_T$, the surface acoustic velocity of the substrate when 50% metallized. Therefore, the total transit time over this path is $(a_1 + b_1)/V_T$. Since, for a flat wavefront, the total transit time between lines 48 and 46 must be equal for any two arbitrarily selected points on line 48, such as points 52 and 56, it follows that the edges 324A and 326A must be so shaped that $$(a_1 + b_1)/V_T = (a_1/V_M) + (b_1/V_F)$$

When this equation is satisfied, a wave front crossing areas A and B will remain flat, yet the reflectivity of area B will be greatly reduced because of the absence of multiple edges of dummy fingers such as 128X and 130Y.

No such criterion need be satisfied in the case of dummy area C. There the reflectivity can be similarly reduced by metallization, bare substrate surface, or any combination of the two without regard to the shape of the metal boundary. Since the crucial acoustic wave which goes from input transducer 314 to output transducer 16 does not pass through area C, it does not matter if that area has a tendency to distort. One acceptable design for the non-critical C portion of the dummy area, illustrated in FIG. 4, is for the bus bar edges to cross area C in respective slanting straight lines 324B and 326B. Within the bus bars are fully metallized areas C1, and outside the bus bars are bare areas C2. Connection to the terminal pad 20 and 22 is made by slanted bus bar extensions 324C and 326C. The slanted edges destroy the phase coherency of any acoustic wave reflected therefrom, relative to fingers 40 of transducer 16.

Figure 5:
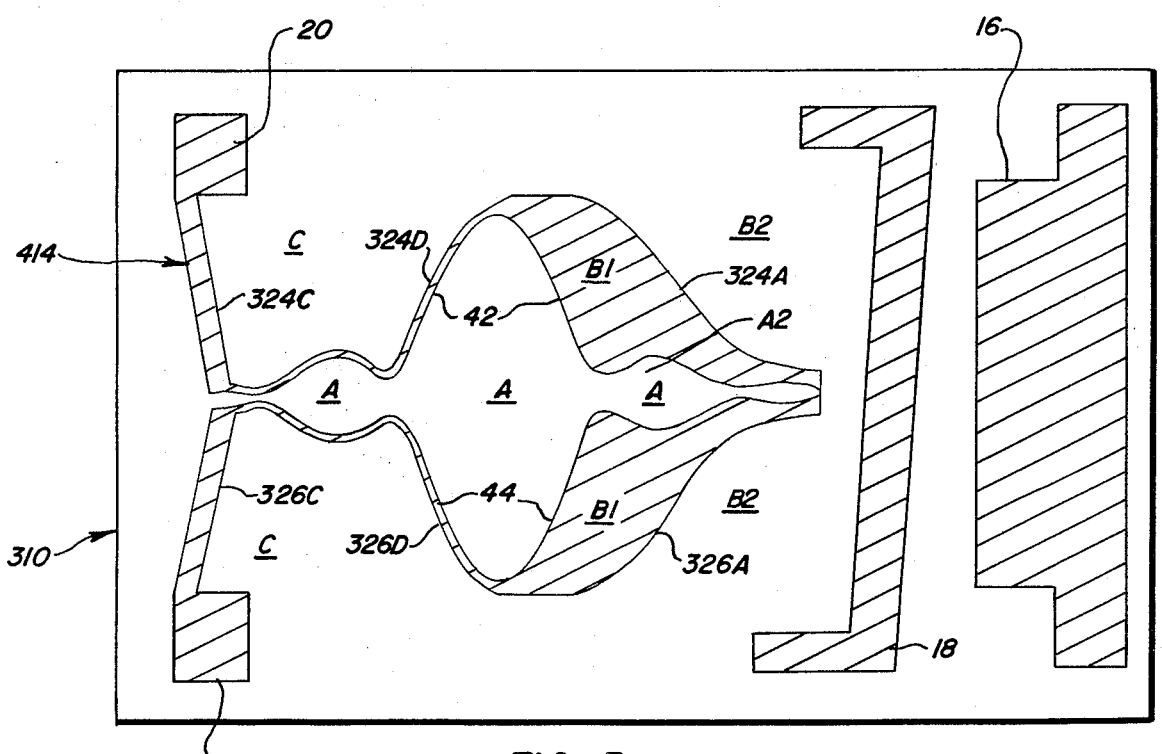
FIG. 5 is a schematic illustration of a filter containing an alternative embodiment of an apodized transducer in accordance with this invention.

An alternative configuration is illustrated in FIG. 5, where filter 310 has an input transducer 414 which is the same as transducer 314 of FIG. 4 except that the non-critical C portion of the dummy area is 100% free of metal, and the bus bars in area C have segments 324D and 326D which conform to the shapes of respective envelopes 42 and 44 (the boundaries of active area A). At the back end of transducer 414 the bus bars diverge toward the terminal pads 20 and 22 along slanted paths 324C and 326C to prevent their reflections from being phase-coherent with respect to fingers 40.

Figure 6:
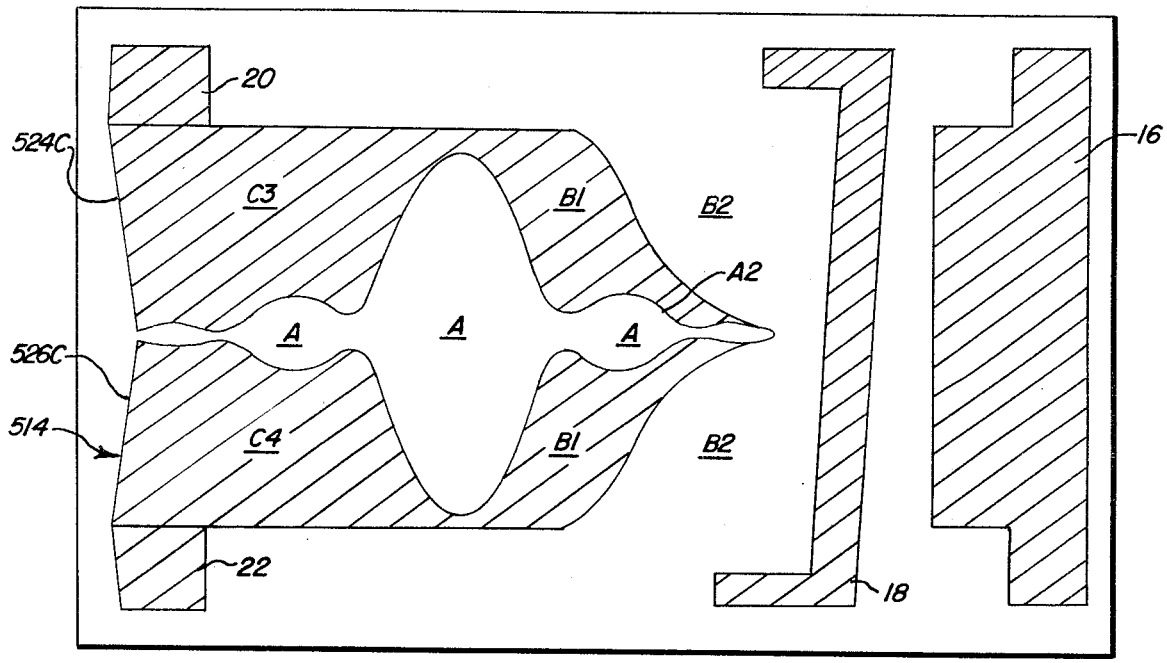
FIG. 6 is a schematic illustration of a filter containing another alternative embodiment of an apodized transducer in accordance with this invention.

Finally, as illustrated in FIG. 6, a transducer 514 may have the non-critical C portion of its dummy area 100% metallized. The two halves of the C area C3 and C4 (divided by active area A) serve as bus bars connecting the active finger portions in area A to terminal pads 20 and 22. In all other respects, transducer 514 is the same as transducers 314 and 414. The rear edges 524C and 526C of areas C3 are slanted to destroy reflection phase-coherency relative to fingers 40.

It may be satisfactory if edges 324A and 326A have the desired mathematical properties only in that portion of the B area which lies outside the maximum width of secondary lobe A2 (i.e., above and below the peaks of lobe A2, as seen in FIGS. 4 through 6), while allowing edges 324A and 326A to assume any convenient shape, not conforming to the equation set forth above, in that portion of the B area which lies between the upper and lower peaks of lobe A2. The consequences of this approach are that wavefront distortion would take place in the region between the upper and lower peaks of lobe A2. But this region covers only a minor fraction of the entire wave front, and in some applications it may not be critical if such a small portion of wavefront is bent. In the usual apodized transducer the differential in size between the primary lobe A1 and the secondary lobes A2 is so great that those portions of the wavefront which lie between the respective upper peaks of lobes A1 and A2 comprise by far the major fraction of the entire wavefront; and that major fraction will be flat so long as edges 324A and 326A conform to the equation set forth above in those areas where edge 324A is above the upper peak, and edge 326A is below the lower peak, of lobe A2.

Figure 7:
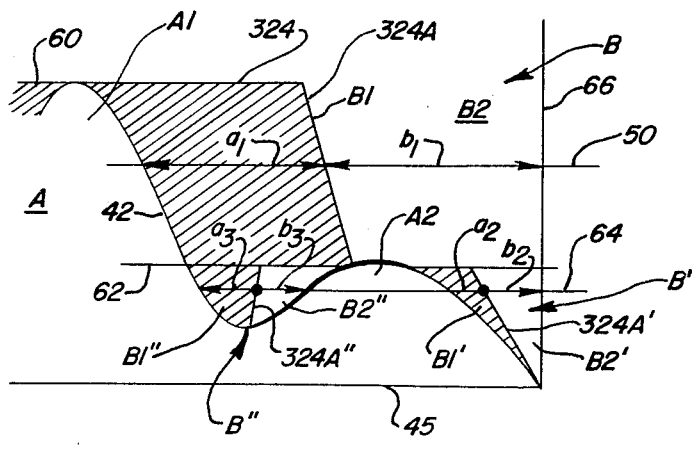
FIG. 7 is a schematic illustration of a fragment of a more sophisticated apodized transducer in accordance with this invention.

In other applications, however, wavefront distortion may not be tolerable even within the relatively small region spanned by lobe A2. Therefore, the enlarged drawing of a portion of a transducer in FIG. 7 illustrates one way of applying the flat wavefront design approach of this invention to the secondary lobe area. The equation set forth above, $$(a_1+b_1)/V_T=(a_1/V_M)+(b_1/V_F)$$

applies to that portion of edge 324A which lies between lines 60 and 62, where these lines both run parallel to axis 45, line 60 passes through the upper peak of primary lobe A1, and line 62 passes through the upper peak of secondary lobe A2. (The same applies to edge 326A in the lower half of the transducer, not illustrated in FIG. 7.) In the region between line 62 and axis 45, however, some additional mathematical considerations must be taken into account. The edge 324A has a discontinuity at line 62; below that line the edge continues as two separate edges 324A' to the right of the secondary lobe A2 and 324A" to the left of lobe A2. The first edge continuation 324A' partitions a portion B' of area B into two subdivisions B1' and B2'. The second edge continuation 324A" similarly partitions another portion B" of area B into two subdivisions B1" and B2".

Portion B' is below the line 62 and to the right of lobe A2. Its subdivision B1' is 100% metallized, and its other subdivision B2' is 100% bare. The edge continuation 324A' which separates these two subdivisions is so shaped that it satisfies the equation $$(a_2+b_2)/V_T=(a_2/V_M)+(b_2/V_F)$$

where $a_2$ is the distance from envelope 42 (the boundary of active area A) to edge 324A', $b_2$ is the distance from edge 324A' to a line 66 perpendicular to axis 45 marking the end of lobe A2, and both distances $a_2$ and $b_2$ are measured along any arbitrarily chosen line 64 which runs parallel to the transducer axis 45 in the region from line 62 to axis 45. For reasons similar to those explained above, this relationship equalizes the acoustic transit times over a path from the middle of lobe A2 to the line 66, and across a wavefront reaching from line 62 to axis 45. Since the acoustic transit times are equal across that portion of the wavefront, it will not be distorted while traversing that path.

Similarly, portion B" is below the line 62 and to the left of lobe A2. Its subdivision B1" is 100% metallized, and its other subdivision B2" is 100% bare. The edge continuation 324A" which separates these two subdivisions is so shaped that it satisfies the equation $$(a_3+b_3)/V_T=(a_3/V_M)+(b_3/V_F)$$

where $a_3$ is the distance from the descending slope of envelope 42 to edge 324A", $b_3$ is the distance from edge 324A" to the ascending slope of envelope 42, and both distances $a_3$ and $b_3$ are measured along any arbitrarily chosen line 64 which runs parallel to axis 45 in the region from line 62 to axis 45. Here this relationship equalizes the acoustic transit times, and thus precludes wavefront distortion, over a path from the intersection of line 62 and envelope 42 to the middle of lobe A2, and across a wavefront reaching from line 62 to axis 45.

The order in which the acoustic wave traverses the paired metallized and bare areas is immaterial, so long as equality of transit times across the wavefront is preserved. Thus, in FIG. 7 the acoustic wavefront, travelling from left to right as it exits from the transducer 314, reaches metallized area B1 before it reaches bare area B2, reaches metallized area B1" before bare area B2", and reaches metallized area B1' before bare area B2'. But it is equally acceptable to reverse any one or more of these area pairs, so that the wavefront reaches bare area B2 before metallized area B1, and/or bare area B2" before metallized area B1", and/or bare area B2' before metallized area B1'. All three of these (independently) optional transpositions are illustrated in FIG. 8.

In the arrangement of FIG. 7 a metallic line must be provided along the length of envelope 42 from metallized area B1" to metallized area B1', in order to assure electrical continuity to energize those fingers of the active lobe area A2 which are located to the right of dummy area B1". For similar reasons, in the arrangement of FIG. 8 there must be a metallic line along the entire length of envelope 42 from the apex of primary lobe A1 to each of the metallized areas B1", B1, and B1'.

Figure 8:
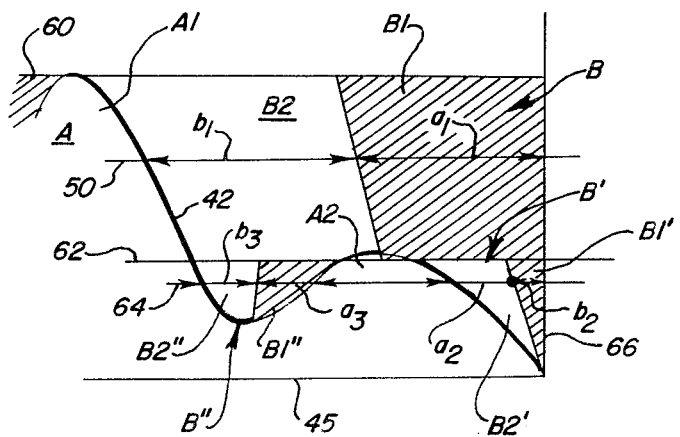
FIG. 8 is a schematic illustration of a fragment of an apodized transducer in accordance with this invention which is an alternative to those of FIGS. 4–7.

Although FIGS. 7 and 8 focus only upon the treatment of the continuations of edge 324A in the upper half of the transducer 314 (above axis 45), it will be readily appreciated that the same mathematical treatment should be extended to edge 326A in the lower half of the transducer. (See FIG. 4.)

It will also be appreciated that, if secondary lobe treatment is not sufficient, the above design approach can be extended to the tertiary lobe A3 (see FIG. 3) or even to higher order lobes, if any.

It will further be appreciated that the treatment here described for the wave exit end of an apodized input transducer (i.e., one which sends an acoustic wave) is equally applicable to the wave entry end of an apodized output transducer (i.e., one which receives an acoustic wave). In the latter case the end of the output transducer which does not face the incoming wave could be treated in any of the alternative ways illustrated for area C in FIGS. 4 through 6.

Thus, the present invention provides a treatment for the dummy area of any apodized input or output transducer, and particularly for that crucial portion of the dummy area which faces toward another transducer acoustically coupled thereto. This treatment reduces dummy reflections without distorting acoustic wavefronts in that crucial area, and is particularly advantageous when the transducer has solid fingers and/or is mounted upon a ceramic substrate and/or a substrate made of a material which has a relatively high dielectric constant, such as $PbTiO_3$.

There may be other variations of the invention which fall within the scope of the novel principles taught herein. For this reason, the disclosed embodiments are to be taken as merely exemplary, and such variations are intended to be covered by the following claims.

I claim:

1. In a surface acoustic wave transducer of the type having:
   a substrate;
   a pair of arrays of electrically conductive elements on said substrate;
   means for connecting an electrical circuit across said pair of arrays;
   said arrays being interdigitated over an active area for coupling between said electrical circuit and an acoustic wave traveling in an acoustic beam direction across the surface of said substrate;
   said arrays including an element at one end of said transducer;
   an inactive area of said transducer in which no elements of said arrays are interdigitated;
   said active area having a first boundary nearest said end element; and
   a continuous covering of material adapted to alter the surface acoustic velocity of said substrate over only a portion of said inactive area between said first boundary and said end element;
   said covered area having a second boundary between said first boundary and said end element;
   said boundary being so shaped that the surface acoustic transit time along a path parallel to said beam direction between said first boundary and said end element is substantially equal across at least the major portion of the aperture of said transducer;
   the improvement wherein said second boundary is shaped along the major portion of its length so as to substantially satisfy the equation $(a+b)/V_T = (a/V_M) + (b/V_F)$ where a is the distance along a line parallel to said beam direction from any point on said first boundary, b is the distance along said parallel line from said intersection with said second boundary to said end element, $V_T$ is the surface acoustic velocity in said active area, $V_M$ is the surface acoustic velocity along said distance a, and $V_F$ is the surface acoustic velocity along said distance b.

2. A transducer as in claim 1 wherein a portion of said inactive area outside said covered area is free of said covering material.

3. A transducer as in claim 1 wherein said inactive area also comprises a region of said transducer on the opposite side of said active area from said end element, and a fraction only of said opposite region is covered by material adapted to alter the surface acoustic velocity of said substrate.

4. A transducer as in claim 1 wherein said inactive area also comprises a region of said transducer on the opposite side of said active area from said end element, and said opposite region is substantially free of material adapted to alter the surface acoustic velocity of said substrate.

5. A transducer as in claim 1 wherein said inactive area comprises a region of said transducer on the opposite side of said active area from said end element, and substantially all of said opposite region is covered by material adapted to alter the surface acoustic velocity of said substrate.

6. A transducer as in claim 1 wherein:
   said first boundary has a curved shape defining a major lobe and at least one minor lobe of said active area;
   said major lobe being wider across said wavefront than said minor lobe;
   said minor lobe being located between said major lobe and said end element;
   said secondary boundary having at least one continuation within the width of said minor lobe which is so shaped that the surface acoustic transit time along a path parallel to said beam direction between said minor lobe and said end element is substantially equal across most of the width of said minor lobe.

7. A transducer as in claim 1 wherein:
   said first boundary has a curved shape defining a major lobe and at least one minor lobe of said active area;
   said major lobe being wider across said wave front than said minor lobe;
   said minor lobe being located between said major lobe and said end element;
   said second boundary having at least one continuation within the width of said minor lobe which is so shaped that the surface acoustic transit time along a path parallel to said beam direction between said minor lobe and said first boundary is substantially equal across most of the width of said minor lobe.

8. A transducer as in claim 1 wherein:
   said first boundary has a curved shape defining a major lobe and at least one minor lobe of said active area;
   said major lobe being wider across said wave front than said minor lobe;
   said second boundary having first and second continuations within the width of said minor lobe;
   said first continuation being so shaped that the surface acoustic transit time along a path parallel to said beam direction between said minor lobe and said end element is substantially equal across most of the width of said minor lobe; and
   said second continuation being so shaped that the surface acoustic transit time along a path parallel to said beam direction between said minor lobe and said first boundary is substantially equal across most of the width of said minor lobe.

9. In a surface acoustic wave device comprising:
   a substrate formed of a piezo-electric ceramic material;

at least two interdigital transducers on said substrate acoustically coupled to each other;

at least one of said transducers having digits apodized to define a partially metallized active area in which electroacoustic transduction occurs and an inactive area in which it does not occur;

said inactive area including an acoustic wave transit region located between said active area of said apodized transducer and said other transducer; and metallic means affecting the surface acoustic velocity of said substrate, so distributed over only a portion of said transit region that the total acoustic transit time from said active area through said transit region is substantially equal across at least a major portion of the aperture of said apodized transducer;

the improvement wherein said piezo-electric ceramic material comprises mostly PbTiO$_3$.

10. In a surface acoustic wave device comprising:

a substrate formed of a piezo-electric ceramic material;

at least two interdigital transducers on said substrate acoustically coupled to each other;

at least one of said transducers having digits apodized to define a partially metallized active area in which electroacoustic transduction occurs and an inactive area in which it does not occur;

said inactive area including an acoustic wave transit region located between said active area of said apodized transducer and said other transducer; and metallic means affecting the surface acoustic velocity of said substrate, so distributed over only a portion of said transit region that the total acoustic transit time from said active area through said transit region is substantially equal across at least a major portion of the aperture of said apodized transducer;

the improvement wherein said apodized transducer has an electrical impedance under 50 ohms.

* * * * *